United States Patent
Yu et al.

(10) Patent No.: US 7,486,073 B2
(45) Date of Patent: Feb. 3, 2009

(54) SLIDING WINDOW RECONSTRUCTION AND PHASE/FIELD MAP UPDATING FOR DYNAMIC CHEMICAL SHIFT IMAGING

(75) Inventors: Huanzhou Yu, Mountain View, CA (US); Charles A. McKenzie, London (CA); Jean H. Brittain, Middleton, WI (US); Norbert J. Pelc, Los Altos, CA (US); Scott B. Reeder, Middleton, WI (US)

(73) Assignees: The Board of Trustees of the Leland Stanford Junior University, Palo Alto, CA (US); General Electric Company, Schenectady, NY (US)

( * ) Notice: Subject to any disclaimer, the term of this patent is extended or adjusted under 35 U.S.C. 154(b) by 101 days.

(21) Appl. No.: 11/738,347

(22) Filed: Apr. 20, 2007

(65) Prior Publication Data

US 2008/0012567 A1 Jan. 17, 2008

Related U.S. Application Data

(60) Provisional application No. 60/745,602, filed on Apr. 25, 2006.

(51) Int. Cl.
*G01V 3/00* (2006.01)
(52) U.S. Cl. .................................................... 324/307
(58) Field of Classification Search ......... 324/300–322; 600/410–435
See application file for complete search history.

(56) References Cited

U.S. PATENT DOCUMENTS

| | | | |
|---|---|---|---|
| 5,810,726 A * | 9/1998 | Van Vaals et al. ........... 600/410 |
| 5,830,143 A * | 11/1998 | Mistretta et al. ............ 600/420 |
| 5,910,728 A | 6/1999 | Sodickson | |
| 5,976,088 A * | 11/1999 | Urbano et al. .............. 600/443 |
| 6,086,537 A * | 7/2000 | Urbano et al. .............. 600/443 |
| 6,228,030 B1 * | 5/2001 | Urbano et al. .............. 600/443 |
| 6,289,232 B1 | 9/2001 | Jakob et al. | |
| 6,377,045 B1 | 4/2002 | Van Den Brink et al. | |
| 6,605,943 B1 | 8/2003 | Clark et al. | |
| 6,714,010 B2 | 3/2004 | Madore | |
| 6,836,114 B2 | 12/2004 | Reddy et al. | |
| 7,298,144 B2 | 11/2007 | Reeder et al. | |
| 7,349,729 B2 | 3/2008 | Reeder et al. | |
| 2007/0247153 A1 * | 10/2007 | Yu et al. ..................... 324/307 |

OTHER PUBLICATIONS

An et al., "Chemical Shift Imaging with Spectrum Modeling", Magn. Reson. Med. (2001) 46(1):126-130.
An et al., "Water-Fat Imaging with Three Orthogonal-Phase Acquisitions", Proceedings 6th Scientific Meeting, International Society for Magnetic Resonance in Medicine (1998), 1866.

(Continued)

*Primary Examiner*—Dixomara Vargas
(74) *Attorney, Agent, or Firm*—Beyer Law Group LLP

(57) ABSTRACT

A method for generating dynamic magnetic resonance images is provided. A cyclical magnetic resonance imaging excitation is applied for a plurality of cycles at a cycle rate. A plurality of magnetic resonance image echoes is acquired for each cycle. A plurality of frames of images is generated from the acquired plurality of magnetic resonance echoes at a frame rate that is at least twice the cycle rate, wherein each frame of the plurality of frames is generated from a plurality of echoes and wherein some of the plurality of frames are generated from magnetic resonance image echoes of adjacent cycles.

12 Claims, 4 Drawing Sheets

OTHER PUBLICATIONS

Brau et al., "Accelerated Ideal Water-Fat Separation Techniques for Single- and Multi-Coil Applications", Proc. Intl. Soc. Mag. Reson. Med. 13 (2005) p. 491.

Bydder et al., "Fat Quantification by Modeling the Variation in Signal Amplitude with TE", Proc. Intl. Soc. Mag. Reson. Med. 14 (2006) p. 2298.

Dixon, "Simple Proton Spectroscopic Imaging", Radiology (1984) 153:189-194.

Fernandez-Real et al., "Cross-Talk between Iron Metabolism and Diabetes", Diabetes (2002), 51(8):2348-2354.

George et al., "Increased Hepatic Iron Concentration in Nonalcoholic Steatohepatitis is Associated with Increased Fibrosis", Gastroenterology (1998), 114(2):311-318.

Glover, G., "Multipoint Dixon Technique for Water and Fat Proton and Susceptibility Imaging", Journal of Magnetic Resonance Imaging (1991), 1:521-530.

McKenzie et al., "Abdominal Three Point Dixon Imaging with Self Calibrating Parallel MRI", in Proc. Intl. Soc. Mag. Reson. Med. 11 (2004), p. 917.

Moirand et al., "A New Syndrome of Liver Iron Overload with Normal Transferin Saturation", The Lancet (1997); 349 (9045):95-97.

Pineda et al., "Cramer-Rao Bounds for Three-Point Decomposition of Water and Fat", Magn. Reson. Med. (2005) 54(3):625-635.

Reeder et al., "Iterative Decomposition of Water and Fat with Echo Asymmetry and Least-Squares Estimation (IDEAL): Application with Fast Spin-Echo Imaging", Magn. Reson. Med. (2005), 54(3):636-644.

Reeder et al., "Multicoil Dixon Chemical Species Separation with an Iterative Least-Squares Estimation Method", Magn. Reson. Med. (2004) 51:35-45.

Westphalen et al., "Liver Fat: Effect of Hepatic Iron Deposition on Evaluation with Opposed-Phase MR Imaging", Radiology (2007), 242(2):450-455.

Wieben et al., "Multi-Echo Balanced SSFP Imaging for Iterative Dixon Reconstruction", Proc. Intl. Soc. Mag. Reson. Med. 13 (2005), p. 2386.

Yu et al., "Field Map Estimation with a Region Growing Scheme for Iterative 3-Point Water-Fat Decomposition", Magn. Reson. Med. (2005) 54(3):1032-1039.

Yu et al., "Single Acquisition Water-Fat Separation: Feasibility Study for Dynamic Imaging", Magn. Reson. Med. (2006) 55(2): 413-422.

Yu et al., "Single Quadrature Echo Water-Fat Separation with Robust Phase Correction", Proc. Intl. Soc. Mag. Reson. Med. 14 (2006), p. 2446.

U.S. Appl. No. 10/690,230, by Reeder et al. entitled "Magnetic Resonance Imaging of Different Chemical Species in a System Having Magnetic Field Heterogeneities", filed on Oct. 23, 2003 (published).

Office Action dated May 28, 2008 from U.S. Appl. No. 11/738,350.

Office Action dated Jun. 18, 2008 from U.S. Appl. No. 11/738,345.

* cited by examiner

SLIDING WINDOW RECONSTRUCTION AND PHASE/FIELD MAP UPDATING FOR DYNAMIC CHEMICAL SHIFT IMAGING

CROSS REFERENCE TO RELATED APPLICATIONS

This application claims priority under 35 U.S.C. §119 from U.S. Provisional Patent Application No. 60/745,602, filed Apr. 25, 2006, entitled MRI METHODS FOR COMBINING SEPARATE SPECIES AND QUANTIFYING A SPECIES which is incorporated herein by reference for all purposes.

GOVERNMENT RIGHTS

The U.S. government has rights in the disclosed invention pursuant to NIH Grant No. P41RR09784 to Stanford University.

BACKGROUND OF THE INVENTION

This invention relates generally to magnetic resonance imaging of an object having different chemical species therein, such as fat and water, and more particularly the invention relates to species imaging in the presence of magnetic field heterogeneity.

Reliable and uniform fat suppression is essential for accurate diagnoses in many areas of MRI. This is particularly true for sequences such as fast spin-echo (FSE), steady-state free precession (SSFP) and gradient echo (GRE) imaging, in which fat is bright and may obscure underline pathology. Although conventional fat saturation may be adequate for areas of the body with relative homogeneous $B_o$ field, there may be many applications in which fat saturation routinely fails. This is particularly true for extremity imaging, off-isocenter imaging, large field of view (FOV) imaging, and challenging areas such as the brachial plexus and skull based, as well as many others. Short-TI inversion recovery (STIR) imaging provides uniform fat suppression, but at a cost of reduced signal-to-noise ratio (SNR) and mixed contrast that is dependent on $T_1$. This latter disadvantage limits STIR imaging to $T_2$ weighted ($T_2$W) applications, such that current $T_1$ weighted ($T_1$ W) applications rely solely on conventional fat-saturation methods. Another fat suppression technique is the use of spectral-spatial or water selective pulses; however, this method is also sensitive to field inhomogeneities.

"In and Out of Phase" Imaging was first described by Dixon in "Simple Proton Spectroscopic Imaging", Radiology (1984) 153:189-194, and was used to exploit the difference in chemical shifts between water and fat and in order to separate water and fat into separate images. Glover et al. further refined this approach, described in Glover G., "Multipoint Dixon Technique for Water and Fat Proton and Susceptibility Imaging", Journal of Magnetic Resonance Imaging (1991) 1:521-530, with a 3-point method that accounts for magnetic field inhomogeneities created by susceptibility differences. This method was applied with FSE imaging by acquiring three images with the readout centered at the spin-echo for one image and symmetrically before and after the spin-echo in the subsequent two images.

Dynamic MRI repeatedly acquires images at the same locations. A common use of dynamic imaging is the investigation of the time course of tissue contrast after injection of a paramagnetic contrast agent. For example, contrast-enhanced liver MRI is a typical dynamic imaging application, where the tumor appears brighter than the normal tissues after the use of contrast. Other more sophisticated applications, such as breast imaging, may require the examination of the signal changes during a period of time to determine the malignancy of the lesions. Repeated acquisitions must be fast enough to provide high temporal resolutions of the signal changes. In addition, fat signal should be eliminated for better lesion conspicuity. Therefore a reliable fat suppression technique is needed for dynamic imaging, which at the same time should add minimum scan time cost to maintain a high temporal resolution.

SUMMARY OF THE INVENTION

To achieve the foregoing and in accordance with the purpose of the present invention, a method for generating dynamic magnetic resonance images is provided. A cyclical magnetic resonance imaging excitation is applied for a plurality of cycles at a cycle rate. A plurality of magnetic resonance image echoes is acquired for each cycle. A plurality of frames of images is generated from the acquired plurality of magnetic resonance echoes at a frame rate that is at least twice the cycle rate, wherein each frame of the plurality of frames is generated from a plurality of echoes and wherein some of the plurality of frames are generated from magnetic resonance image echoes of adjacent cycles.

In another manifestation of the invention, a method for generating dynamic magnetic resonance images is provided. A) A current magnetic resonance imaging excitation is applied. B) A first magnetic resonance image echo is acquired. C) A first magnetic resonance image is generated from the first magnetic resonance image echo and at least one magnetic resonance image echo from a previous magnetic imaging excitation. D) A second magnetic resonance image echo is acquired. E) A second magnetic resonance image is generated from at least the first magnetic resonance image echo and the second magnetic resonance image echo. F) The process returns to step A.

In another manifestation of the invention, an apparatus for providing magnetic resonance images is provided. A magnet system is provided. A controller is electrically connected to the magnet system, comprising a display, at least one processor, and computer readable media. The computer readable media comprises computer readable code for applying a cyclical magnetic resonance imaging excitation for a plurality of cycles at a cycle rate, computer readable code for acquiring a plurality of magnetic resonance image echoes for each cycle, computer readable code for generating a plurality of frames of images from the acquired plurality of magnetic resonance echoes at a frame rate that is at least twice the cycle rate, wherein each frame of the plurality of frames is generated from a plurality of echoes and wherein some of the plurality of frames are generated from magnetic resonance image echoes of adjacent cycles, and computer readable code for displaying the plurality of frames to provide a dynamic image on the display.

The invention, objects, and features thereof will be more readily apparent from the following detailed description and appended claims when taken with the drawings.

DETAILED DESCRIPTION OF ILLUSTRATED EMBODIMENTS

Figure 2:
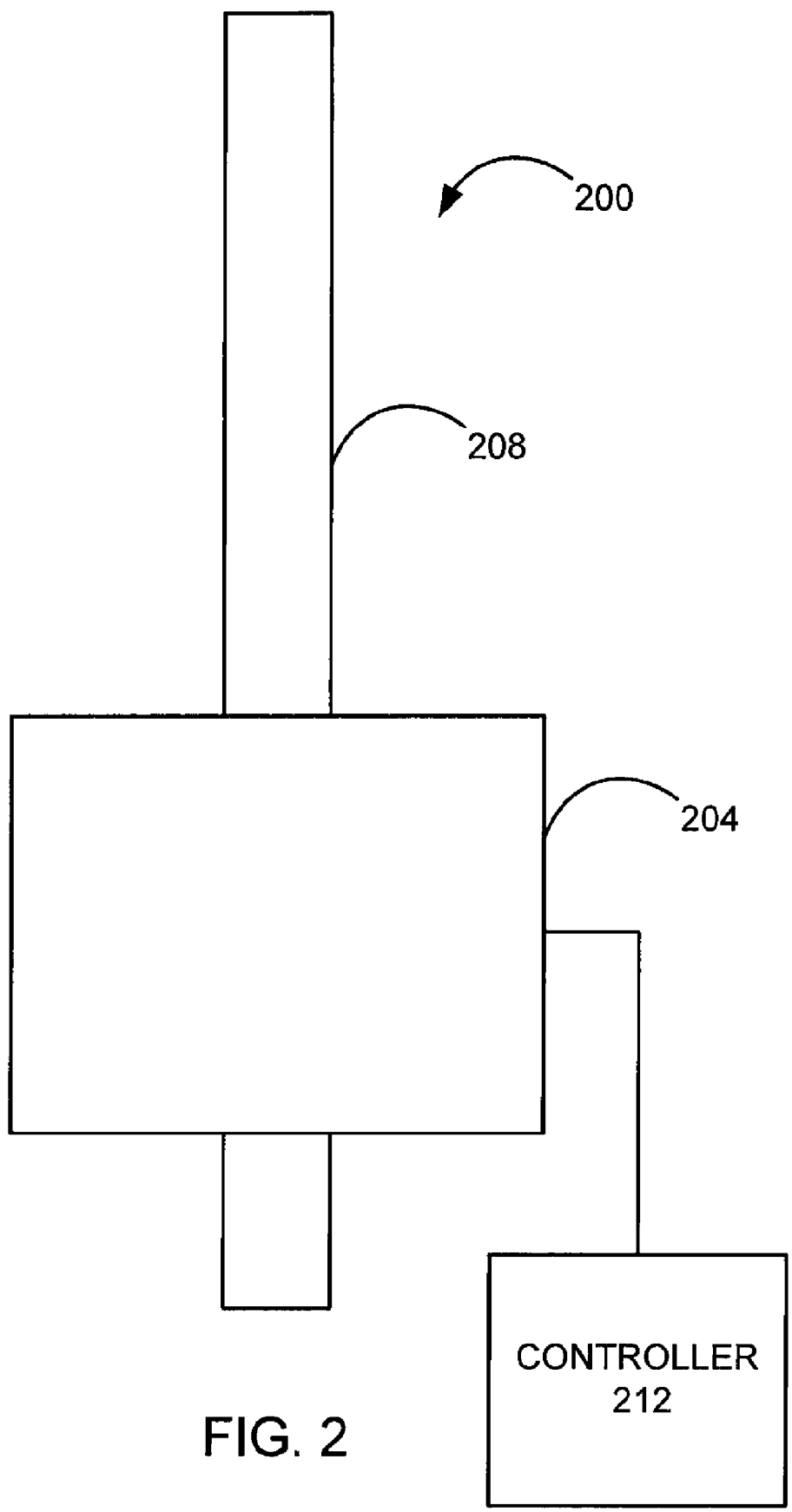
FIG. 2 is a schematic top view of a magnetic resonance imaging (MRI) system 200 that may be used in an embodiment of the invention.

FIG. 2 is a schematic top view of a magnetic resonance imaging (MRI) system 200 that may be used in an embodiment of the invention. The MRI system 200 comprises a magnet system 204, a patient transport table 208 connected to the magnet system, and a controller 212 controllably connected to the magnet system. In one example, a patient would lie on the patient transport table 208 and the magnet system 204 would pass around the patient. The controller 212 would control magnetic fields and radio frequency (RF) signals provided by the magnet system 204 and would receive signals from detectors in the magnet system 204.

Figure 3A:
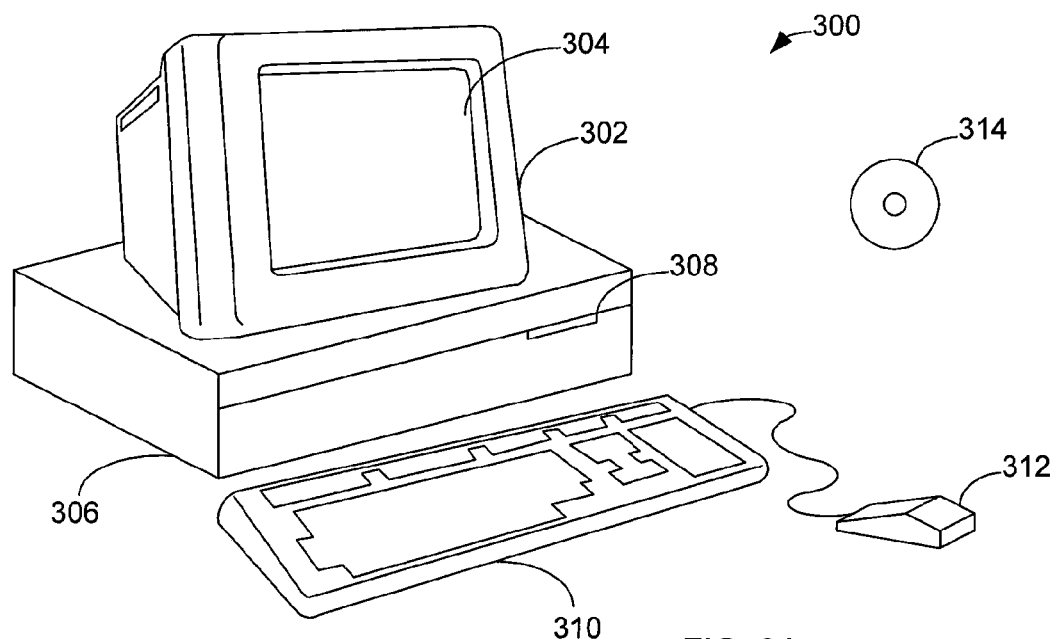
FIGS. 3A and 3B illustrate a computer system, which is suitable for implementing a controller 212 used in embodiments of the present invention.
Figure 3B:
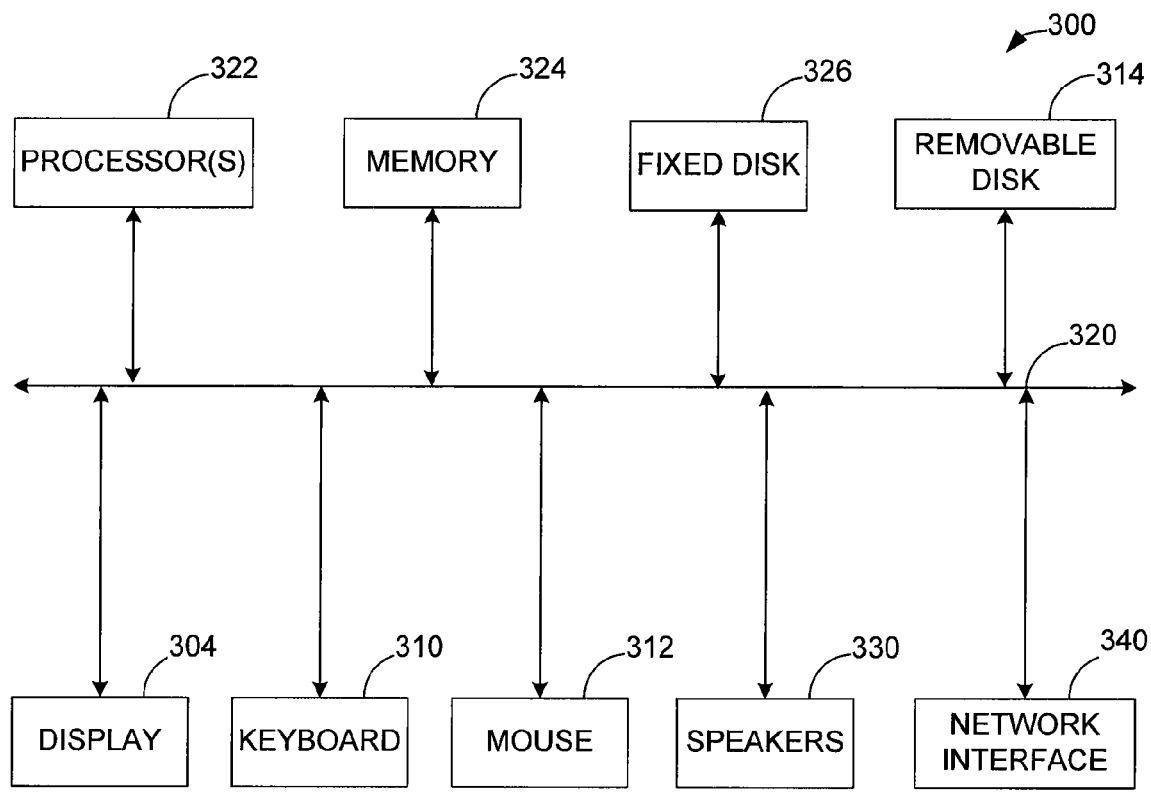

FIGS. 3A and 3B illustrate a computer system 300, which is suitable for implementing a controller 212 used in embodiments of the present invention. FIG. 3A shows one possible physical form of the computer system. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 are a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bidirectional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 1:
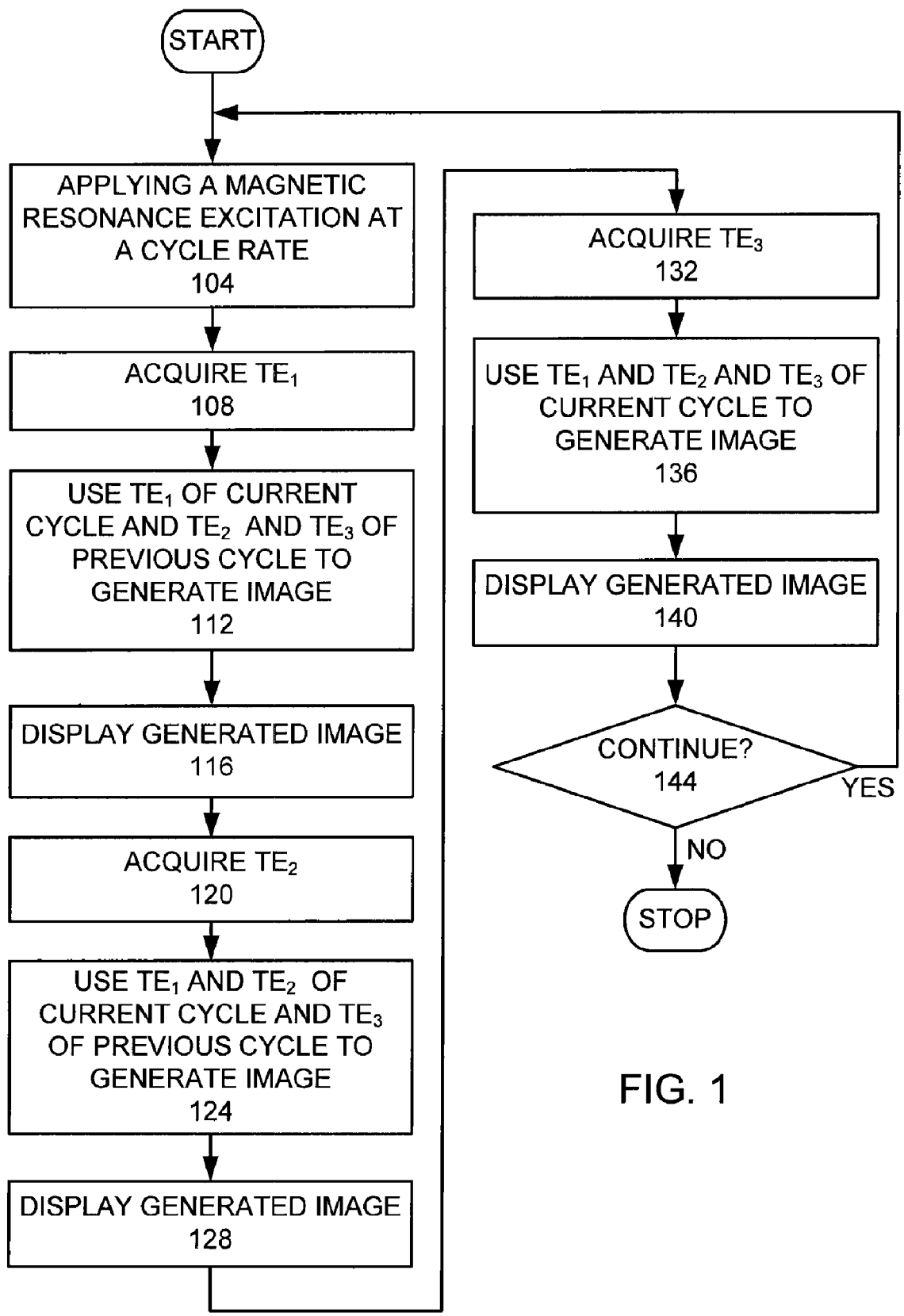
FIG. 1 is a flow chart of an embodiment of the invention.

FIG. 1 is a flow chart of an embodiment of the invention. Magnetic resonance excitation is applied at a cycle rate (step 104). The controller 212 uses magnet system 204 and patient transport table 208 to cyclically apply the magnetic resonance excitation. A $TE_1$ echo signal is acquired (step 108). The controller 212 causes the magnetic system 204 to acquire an echo at a specified time of phase after the excitation. The current $TE_1$ echo signal and $TE_2$ and $TE_3$ echo signals from the previous cycle are used to generate an image (step 112). The generated image is displayed (step 116). A $TE_2$ echo signal is acquired (step 120). The controller 212 causes the magnetic system 204 to acquire an echo at a specified time of phase after the excitation to acquire the $TE_2$ echo signal. The current $TE_1$ and $TE_2$ echo signals and the $TE_3$ echo signal from the previous cycle are used to generate an image (step 124). The generated image is displayed (step 128). A $TE_3$ echo signal is acquired (step 132). The controller 212 causes the magnetic system 204 to acquire an echo at a specified time of phase after the excitation to acquire the $TE_3$ echo signal. The current $TE_1$, $TE_2$, and $TE_3$ echo signals are used to generate an image (step 136). The generated image is displayed (step 140). The process may be continued (step 144). In such a case the process goes back to step 104, where the magnetic resonance excitation is again applied (step 104). Otherwise, the process is stopped. The process of using the echo image collected at the current excitation as well as the adjacent echo images is known as a sliding window reconstruction. The continuous display of the created images (step 116, 128, 140) forms a dynamic series of the magnetic resonance images.

As can be seen in this example, three image frames are generated for every magnetic resonance excitation cycle. The main features in the above process apply a cyclical magnetic resonance imaging excitation for a plurality of cycles at a cycle rate. A plurality of magnetic resonance image echoes is acquired for each cycle. A plurality of frames of images are generated from the acquired plurality of magnetic resonance echoes at a frame rate that is at least twice the cycle rate, where each frame of the plurality of frames is generated from a plurality of echoes, and where some of the frames are generated from magnetic resonance image echoes of adjacent previous cycles. In the example described in FIG. 1, the frame rate is 3 times of the cycle rate.

EXAMPLES

Various examples that use the inventive method and apparatus will be provided.

In one example, a sliding window is used to provide a magnetic resonance dynamic image using a Dixon species separation or iterative least-squared decomposition with echo asymmetry and least squares estimation (IDEAL) to separate a first species signal and a second species signals, which are then used to form a dynamic series of images. In other examples, other processes are used. In this example, each first species signal and second species signal is generated using three echoes obtained during each excitation cycle.

Figure 4:
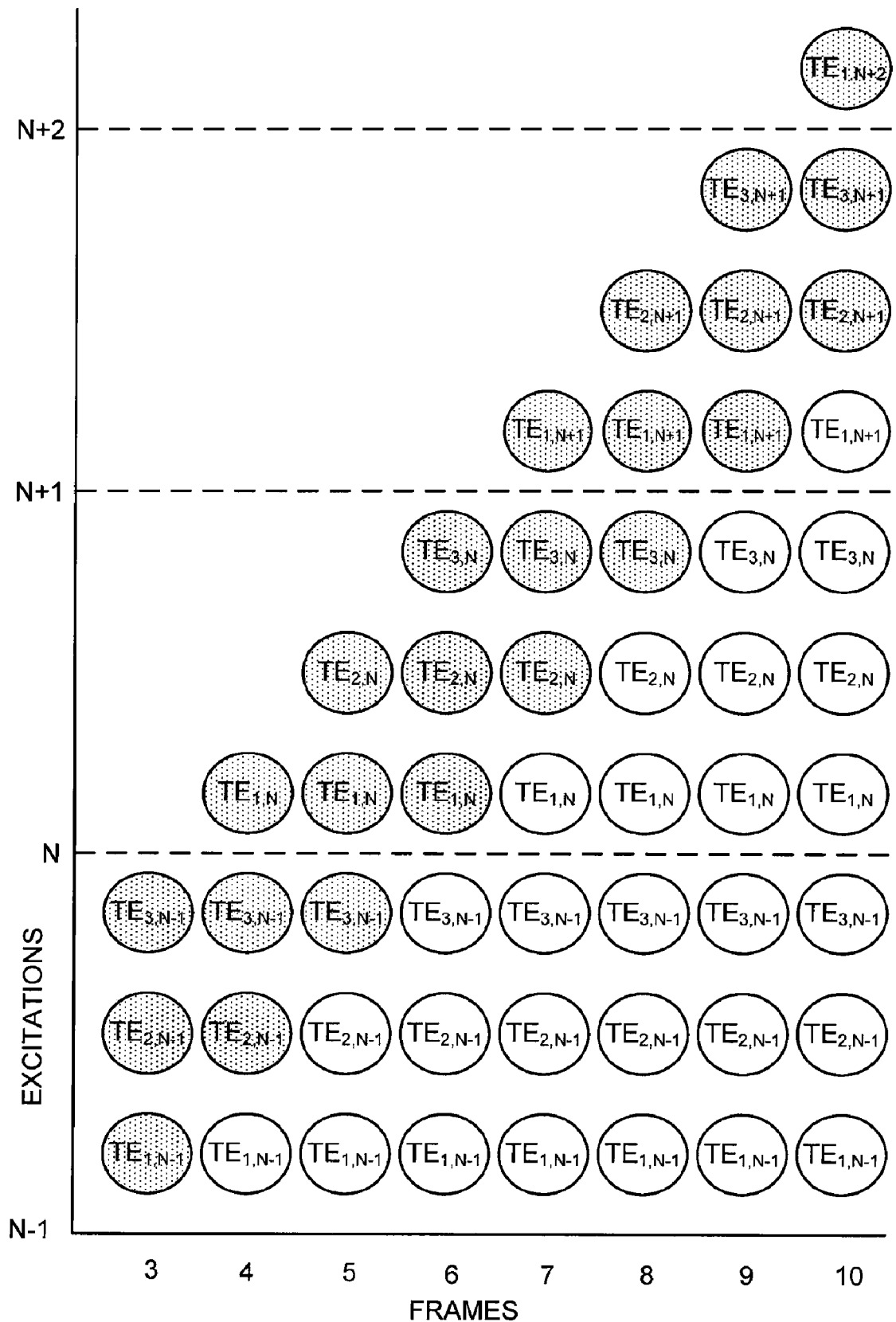
FIG. 4 is a graph illustrating echoes and frame rates.

FIG. 4 illustrates how three echoes are used for each image frame in this example. As shown, an excitation N−1 is applied. Three image frames are generated, with only frame 3 shown, where frame 3 is generated from $TE_{1,N-1}$, $TE_{2,N-1}$ and $TE_{3,N-1}$. The echoes used to generate the first and second species signals for a particular frame are shaded for that frame. An excitation N is applied. A $TE_{1,N}$ echo is acquired. For frame 4, the first and second species signals are generated from echoes $TE_{2,N-1}$, $TE_{3,N-1}$ and $TE_{1,N}$, as indicated by the shading. An image is generated from the first and second species signals and displayed. A $TE_{2,N}$ echo is acquired. For frame 5, the first and second species signals are generated from echoes $TE_{3,N-1}$, $TE_{1,N}$ and $TE_{2,N}$, as indicated by the shading. An image is generated from the first and second species signals and displayed. A $TE_{3,N}$ echo is acquired. For frame 6, the first and second species signals are generated from echoes $TE_{1,N}$, $TE_{2,N}$ and $TE_{3,N}$, as indicated by the shading. An image is generated from the first and second species signals and displayed. Thus three image frames of the dynamic image are provided between excitation N and excitation N+1. In this example, a frame rate that is 3 times of the cycle rate is achieved, as opposing to a frame rate that is equal to the cycle rate if the sliding reconstruction had not been used.

An excitation N+1 is applied. A $TE_{1,N+1}$ echo is acquired. For frame 7 the first and second species signals are generated from echoes $TE_{2,N}$, $TE_{3,N}$, and $TE_{1,N+1}$, as indicated by the shading. An image is generated from the first and second species signals and displayed. A $TE_{2,N+1}$ echo is acquired. For frame 8, the first and second species signals are generated from echoes $TE_{3,N}$, $TE_{1,N+1}$ and $TE_{2,N+1}$, as indicated by the shading. An image is generated from the first and second species signals and displayed. A $TE_{3,N+1}$ echo is acquired. For frame 9, the first and second species signals are generated from echoes $TE_{1,N+1}$, $TE_{2,N+1}$, and $TE_{3,N+1}$, as indicated by the shading. An image is generated from the first and second species signals and displayed. Thus three frames of the dynamic image are provided between excitation N+1 and excitation N+2.

An example of a first species may be fat. The first species signal may be conditioned. The conditioning may provide chemical shift, rescale intensity, weighting, shifted in space, rotated, or another re-orientation, or another mathematical operation may be performed on the first species signal. Other examples may not provide this conditioning step.

An example of a second species may be water, so that the first species and second species are different. The second species signal may be conditioned. The conditioning may provide chemical shift, rescale intensity, shifted in space, rotated, or another re-orientation or spatial shift, or another mathematical operation may be performed on the second species signal. Other embodiments may not provide this conditioning step.

The generation of a first species signal and a second species signal from the same magnetic resonance data is described in U.S. patent application Ser. No. 10/690,230, by Reeder et al. entitled "Magnetic Resonance Imaging of Different Chemical Species in a System Having Magnetic Field Heterogeneities," filed on Oct. 23, 2003, which is incorporated by reference for all purposes.

H. Yu, S. B. Reeder, C. A. McKenzie et al., in "Single Acquisition Water-Fat Separation: Feasibility Study for Dynamic Imaging", Magn. Reson. Med. (2006) 55(2):413-422, describes a single point technique (1+ pt) for reduced data acquisition method for the separation water and fat in dynamic imaging. In this method, a separate 3-point calibration scan using a 3-point reconstruction method is used to obtain a separate field map as well as a constant phase map, which is the phase of water and fat at TE=0. A single-echo image is then acquired with the phase between water and fat in quadrature, i.e.: $\pi/2+\pi k$. The effects of the field map and constant phase map are then demodulated from this image in order to obtain an image with water along the real channel and fat signal in the imaginary channel. Separate water and fat images are subsequently obtained from the real and imaginary parts of the demodulated complex image. The 1+ method is well suited for dynamic contrast enhanced imaging. In such applications, the object of interest (the breast, for example) does not move between the calibration and dynamic contrast enhanced scans. Acquisition of multiple quadrature images makes this method a very rapid and efficient technique capable of robust water-fat separation in minimal scan time.

Although the 1+ pt method adds no scan time penalty during the dynamic study, thus maintains the temporal resolution, the key assumption is that the phase is static over the time. A recent in-vitro study by Tashma Hoory et al. showed that the pre-calibrated phases remain relevant during a dynamic contrast enhanced acquisition even when twice the contrast concentration typical of clinical breast applications is used. At high concentration, contrast could still cause phase drifts in arteries or veins during bolus injection, or in the urinary collecting system where very high concentration of contrast may occur. Other sources of phase difference between the calibration scan and the dynamic scans may include changes in the relative position of the patient to the coils, cardiac motion, system instabilities, inconsistent breath-holds and other factors that are difficult to measure and quantify. In the presence of phase drift, the phase needs to be re-calculated during the dynamic scan by acquiring a complete cycle of images (3-echo images). The phase update could be an effective way to compensate for phase inconsistency and maintain accurate water-fat separation, although at some cost in scan time overhead. It can be performed in a sliding window approach described above. In one example, based on the 1+ pt reconstruction, $[TE_1, TE_2, TE_3]$ can be $[\pi/2+k\pi, \pi/2+(k+1)\pi, \pi/2+(k+2)\pi]$, where quadature water-fat decomposition can be performed at each frame, and the three source images in the window allow estimation of the current phase. Alternatively, IDEAL echo times can be used, which offers better noise performance. In addition, they are not necessarily in a strictly repeated and interleaved order. For example, frame 1: TE=$\pi$, frame 2: TE=$2\pi$, frame 3: $3\pi/2$, frame 4: $5\pi/2$ . . . , which starts water-fat separation from the second frame using a 2-pt reconstruction scheme. Furthermore, the decision to perform sliding window acquisition and reconstruction can be made in real-time. The sliding window acquisition could be used only when a phase drift is observed. Otherwise a fixed echo time is repeatedly used like the 1+ pt method.

Theory:

Pulse Sequence and Image Reconstruction

IDEAL uses an iterative least-squares method that is compatible with multi-coil imaging. In this method, an iterative method is used to determine the local field map ($B_o$ inhomogeneity) in the least squares sense. The field map is subsequently demodulated from the signal in the source images. This signal is then decomposed into separate water and fat signals using a least-squares solution matrix inversion. This latter step is similar to a least-squares approach described in L. An, Q. S. Xiang, "Chemical Shift Imaging with Spectrum Modeling", Magn. Reson. Med. (2001) 46(1):126-130 (hereinafter An), which are restricted to equally spaced echo shifts. IDEAL uses a region growing reconstruction algorithm to prevent water-fat "swaps" that can occur from the natural ambiguity between water and fat signals, e.g. for an acquisition at 1.5 T with the center frequency set to water, water that is off-resonance by −210 Hz has similar signal to fat that is on-resonance.

By providing multiple frames for each cycle, a more dynamic and faster image is provided, which helps to overcome a slowness resulting from multiscan processes. It has been found that by sharing echoes between cycles, a smooth dynamic image may be provided.

In other examples, other numbers of echoes may used for each excitation. For example, only two echoes may be acquired for each excitation. In such an example, two echoes may be used to create each image. In particular, the two echoes may correspond to the phase shifts of in-phase (IP) and out-of-phase (OP) for the two species. In another example, four or more echoes may be acquired for each excitation. In such an example, four or more echoes may be used to create each image.

U.S. patent application Ser. No. 11/738,339, by Scott B. Reeder et al., entitled "MRI METHODS FOR COMBINING SEPARATE SPECIES AND QUANTIFYING A SPECIES" filed concurrently herewith, teaches MRI methods for combining separate species and quantifying a species; U.S. patent application Ser. No. 11/738,340, by Charles A. McKenzie et al., entitled "SELF-CALIBRATION METHODS FOR PARALLEL IMAGING AND MULTIPOINT WATER-FAT SEPARATION METHODS" filed concurrently herewith, teaches self-calibration methods for parallel imaging and multipoint water-fat separation methods; U.S. patent application Ser. No. 11/738,343, by Angel R. Pineda et al., entitled "MAXIMUM LIKELIHOOD ESTIMATOR IN THE PRESENCE OF NON-IDENTICALLY DISTRIBUTED NOISE FOR DECOMPOSITION OF CHEMICAL SPECIES IN MRI" filed concurrently herewith, teaches maximum likelihood estimator in the presence of non-identically distributed noise for decomposition of chemical species in MRI; U.S. patent application Ser. No. 11/738,345, by Zhifei Wen et al., entitled "REGULARIZED SPECIES SEPARATION" filed concurrently herewith, teaches regularized species separation; U.S. patent application Ser. No. 11/738,350, by Huanzhou Yu et al., entitled "SIMULTANEOUS CHEMICAL SPECIES SEPARATION AND $T_2$* MEASUREMENT USING MRI" filed concurrently herewith, teaches simultaneous chemical species separation and $T_2$* measurement using MRI; U.S. patent application Ser. No. 11/738,352, by Charles A. McKenzie et al., entitled "CALIBRATION MAPS FOR PARALLEL IMAGING FREE OF CHEMICAL SHIFT ARTIFACT" filed concurrently herewith, teaches calibration maps for parallel imaging free of chemical shift artifact, all of which are incorporated by reference herein.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for generating dynamic magnetic resonance images, comprising:
    a) applying a cyclical magnetic resonance imaging excitation for a plurality of cycles at a cycle rate;
    b) acquiring a plurality of magnetic resonance image echoes for each cycle; and
    c) generating a plurality of frames of images from the acquired plurality of magnetic resonance echoes at a frame rate that is at least twice the cycle rate, wherein each frame of the plurality of frames is generated from a plurality of echoes and wherein some of the plurality of frames are generated from magnetic resonance image echoes of adjacent cycles.

2. The method as recited in claim 1, wherein the plurality of frames that are generated from magnetic resonance image echoes of adjacent cycles are generated from magnetic resonance image echoes of an adjacent previous cycle.

3. The method, as recited in claim 2, wherein the acquiring a plurality of magnetic resonance image echoes for each cycle acquires at least three echoes for each cycle and wherein the generating the plurality of frames provides a frame rate at least three times the cycle rate and wherein each frame is generated from at least three echoes.

4. The method as recited in claim 3, wherein the generating a plurality of frames of images employs Dixon species separation or iterative least-squared decomposition with echo asymmetry and least squares estimation (IDEAL).

5. The method, as recited in claim 4, wherein the generating a plurality of frames of images further comprises:
    generating a first species signal;
    generating a second species signal.

6. The method of claim 5, further comprising displaying the plurality of frames to provide a dynamic series of images.

7. The method, as recited in claim 2, wherein the generating a plurality of frames of images further comprises:
    generating a first species signal;
    generating a second species signal.

8. The method of claim 2, further comprising displaying the plurality of frames to provide a dynamic series of images.

9. The method as recited in claim 2, wherein the generating a plurality of frames of images employs Dixon species separation or iterative least-squared decomposition with echo asymmetry and least squares estimation (IDEAL).

10. The method, as recited in claim 1, wherein the acquiring a plurality of magnetic resonance image echoes for each cycle acquires at least three echoes for each cycle and wherein the generating the plurality of frames provides a frame rate at least three times the cycle rate and wherein each frame is generated from at least three echoes.

11. An apparatus for providing magnetic resonance images, comprising:
    a magnet system;
    a controller electrically connected to the magnet system, comprising:
        a display;
        at least one processor; and computer readable media, comprising:
  computer readable code for applying a cyclical magnetic resonance imaging excitation for a plurality of cycles at a cycle rate;
  computer readable code for acquiring a plurality of magnetic resonance image echoes for each cycle;
  computer readable code for generating a plurality of frames of images from the acquired plurality of magnetic resonance echoes at a frame rate that is at least twice the cycle rate, wherein each frame of the plurality of frames is generated from a plurality of echoes and wherein some of the plurality of frames are generated from magnetic resonance image echoes of adjacent cycles; and
  computer readable code for displaying the plurality of frames to provide a dynamic image on the display.

12. The apparatus as recited in claim 11, wherein the plurality of frames that are generated from magnetic resonance image echoes of adjacent cycles are generated from magnetic resonance image echoes of an adjacent previous cycle.

* * * * *